United States Patent [19]

Gorablenkow

[11] Patent Number: 5,166,600
[45] Date of Patent: Nov. 24, 1992

[54] MEASURING DEVICE HAVING AN AUXILIARY ELECTRODE FOR A GAS-INSULATED ENCASED HIGH-VOLTAGE CONDUCTOR

[75] Inventor: Jörg Gorablenkow, Berlin, Fed. Rep. of Germany

[73] Assignee: Siemens Aktiengesellschaft, Berlin & Munich, Fed. Rep. of Germany

[21] Appl. No.: 761,988

[22] PCT Filed: Mar. 22, 1989

[86] PCT No.: PCT/DE89/00190

§ 371 Date: Sep. 23, 1991

§ 102(e) Date: Sep. 23, 1991

[87] PCT Pub. No.: WO90/11530

PCT Pub. Date: Oct. 4, 1990

[51] Int. Cl.$^5$ .......................... H01H 9/50; H01G 1/00
[52] U.S. Cl. .................... 324/126; 361/306; 323/364
[58] Field of Search ............... 361/302, 303, 306, 308, 361/323, 326; 323/364, 370; 324/72, 96, 126, 457, 458, 127, 133; 174/113 H, 142, 143

[56] References Cited

U.S. PATENT DOCUMENTS

| | | | |
|---|---|---|---|
| 2,613,345 | 10/1952 | Osterand | 323/364 |
| 3,101,443 | 8/1963 | Fried | 323/370 |
| 3,390,331 | 6/1968 | Brown et al. | 324/126 |
| 3,396,339 | 8/1968 | Miram | 324/126 |
| 3,398,340 | 8/1968 | Geoghegan | 361/308 |
| 3,419,769 | 12/1968 | Elnekare et al. | 361/326 |
| 3,829,744 | 8/1974 | Rampach | 361/326 |
| 3,835,353 | 9/1974 | Hermstein | |
| 3,939,412 | 2/1976 | Hermstein et al. | 324/96 |
| 4,007,406 | 2/1977 | Weisbrod | 361/326 |
| 4,295,094 | 10/1981 | Wilneker et al. | 324/126 |
| 4,617,513 | 10/1987 | Reinhardt | |
| 4,963,819 | 10/1990 | Clarke et al. | 324/126 |

FOREIGN PATENT DOCUMENTS

| | | | |
|---|---|---|---|
| 0134187 | 4/1985 | European Pat. Off. | |
| 2341073 | 1/1980 | Fed. Rep. of Germany | |
| 3121795 | 12/1982 | Fed. Rep. of Germany | |
| 3610742 | 10/1987 | Fed. Rep. of Germany | 324/126 |
| 2240454 | 3/1975 | France | |
| 0050671 | 3/1987 | Japan | 324/126 |

Primary Examiner—Ernest F. Karlsen
Assistant Examiner—William J. Burns
Attorney, Agent, or Firm—Kenyon & Kenyon

[57] ABSTRACT

The measuring device is incorporated in a projection of the casing. Its auxiliary electrode forms the high-voltage capacitor of a capacitive voltage divider together with the internal conductor, and is connected with the casing via a low-voltage capacitor. The measurement connection emerges from the projection in gas-tight manner, and is connected to a display or measuring device. In order to be able to detect high-frequency compensation operations, also, the low-voltage capacitor consists of two nested cones with a solid dielectric. A terminal resistor which is connected to the internal conductor of a gas-tight coaxial connector is arranged in the inside cone. The terminal resistor is adapted to the characteristic impedance of the coaxial connector and that of the measurement connection. The measuring device with the auxiliary electrode can be inserted into tubular gas connections in the casing of a high-voltage conductor, especially in compressed gas-insulated, encased high-voltage switch conductors.

20 Claims, 1 Drawing Sheet

MEASURING DEVICE HAVING AN AUXILIARY ELECTRODE FOR A GAS-INSULATED ENCASED HIGH-VOLTAGE CONDUCTOR

BACKGROUND OF THE INVENTION

The invention relates to a measuring device with an auxiliary electrode, arranged and insulated in a tubular projection on the mantle surface of the casing of a gas-insulated, encased high-voltage conductor. The measuring device forms a high-voltage capacitor of a capacitive voltage divider with the internal conductor of the high-voltage conductor, which is insulated in the casing. The measuring device is also connected with the casing via a low-voltage capacitor, where the auxiliary electrode is connected to a display or measuring device via a measurement connection emerging out of the projection in gas-tight manner, via a passage. The low voltage capacitor is formed from two nested cones having a specific distance from one another, wherein one cone is an outside cone, and the other cone is an inside cone.

Such a measuring device for a gas-insulated, encased high-voltage installation, especially a high-voltage switch gear compressed gas-insulated with $SF_6$, and encased with metal, is disclosed in DE-AS 23 41 073. With the known measuring device, which functions like a capacitive voltage divider, the voltage of an internal conductor of the encased high-voltage conductor is measured, where the internal conductor is used as part of the high-voltage capacitor. The auxiliary electrode used for this measurement of the applied operating voltage is inserted in a tubular projection of the casing, which in turn is closed off with a cover. The auxiliary electrode has relatively large dimensions, to guarantee measurement accuracy at the operating frequency.

EP 0 134 187 A 3 discloses a measuring device to determine partial discharges in a high-voltage conductor switch with a capacitive voltage divider, wherein inside and outside cones serve to adapt the characteristic impedance of a measurement cable to the measuring device. This is designed to avoid signal reflections at the measurement connection. However, the usual casing projections used with known conductors with measurement covers, demonstrate low inherent resonance frequencies because of their large size. As a result, the upper limit frequency of the voltages to be detected is limited.

The present invention is directed to the problem of developing a measuring device with an auxiliary electrode for measuring voltage in encased, compressed gas-insulated high-voltage conductors that has a high inherent resonance frequency and thus permits a very high upper limit frequency for the voltages to be measured, and also allows measurement of the alternating voltage at the operating frequency.

SUMMARY OF THE INVENTION

The present invention solves this problem by forming the low-voltage capacitor from two cones, nested together with opposite angles of inclination. These two cones have a distance between them, with the interstice filled by a solid dielectric having a dielectric constant that remains constant even at high frequencies. The inside cone is connected with the auxiliary electrode and is connected with the internal conductor of a gas-tight coaxial connector for a shielded measurement connection via a terminal resistor. The terminal resistor is adapted to the characteristic impedance of the coaxial connector and/or that of the shielded measurement connection. The contact surface of the connector for shielding the measurement connection is galvanically connected with the casing and the outside cone.

The structure of the low-voltage capacitor, consisting of two nested cones, results in an extremely compact cylindrical arrangement with the carrier element. The cone-shaped structure of the low-voltage capacitor also prevents electrical oscillations, such as those that can occur with flat bar-shaped electrodes of a capacitor. The inherent resonance frequency of this arrangement is therefore very high, which permits a correspondingly high upper limit frequency, e.g. in the range of approximately 1 GHz, for the desired measurements of the high-frequency compensation operations, which are brought about by switching operations within the conductor, for example. Furthermore, the thickness of the solid dielectric arranged between the cones can be selected to be sufficiently small so that in spite of the small outside diameter, a sufficiently large capacitance of the low-voltage capacitor can be achieved for measuring the alternating voltage at operating frequency, with high resistance measurement amplifiers.

The cone-shaped nested structure of the low-voltage capacitor, in combination with the coaxial gas-tight connector for the shielded measurement connection, furthermore results in a cylindrical, coaxial, completely shielded structure of the entire measuring device with an integrated attenuation resistor (terminal resistor), which is adapted to the characteristic impedance of the coaxial connector and/or that of the shielded measurement connection. Because of this design, with small outside dimensions, the measuring device can be installed, even subsequently, at any desired location of an encased, gas-insulated high-voltage conductor which is already in operation, e.g. in a tubular projection already present for a gas connection.

It is recommended to provide a carrier element which braces the two cones against one another, and furthermore produces a galvanic contact both to the external conductor, i.e. the outer contact surface, of the coaxial connector, and to the casing. Simple production and assembly results if a sleeve nut which can be screwed onto an adapter and the outside cone is used as the carrier element, where the adapter carries the coaxial connector in gas-tight manner and is also connected in gas-tight manner with the tubular projection.

Since the coaxial connector used in the measuring device already forms a gas-tight component, the entire measuring device is made gas-tight with respect to the tubular projection in that a gas seal is provided also between the latter and the adapter. The internal conductor of the coaxial connector is connected with the inside cone via the terminal resistor, and the external conductor of the coaxial connector is galvanically connected with the casing. This gas seal can advantageously consist of two gas seal rings connected via a center disk and arranged behind one another, so that the penetration depth of the auxiliary electrode into the interior of the casing can be varied by changing the height of the disk. In this way, the capacity of the high-voltage capacitor of the capacitive voltage divider and thus the divider ratio can be changed.

An advantageous development of the measuring device according to the present invention provides that the distance between cone surfaces of the inside cone and the outside cone is equally great in all regions of the interstice between the inside cone and the outside cone. A very small distance can be selected, in order to obtain a high capacitance of the low-voltage capacitor.

In the following, the invention is explained in greater detail on the basis of the embodiment shown in FIGS. 1 and 2 of the drawing, but the invention is not limited to this embodiment.

DETAILED DESCRIPTION

Figure 1:
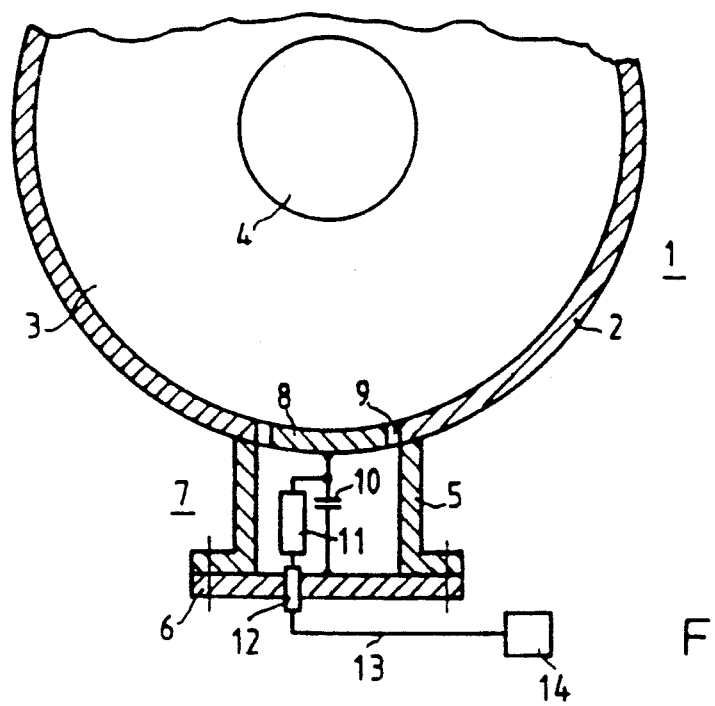
FIG. 1 shows a schematic of the gas-insulated, encased high-voltage conductor with the measuring device.

A gas-insulated, encased high-voltage conductor 1 has a grounded, metallic casing 2, with an internal conductor 4 arranged in the interior 3 of the casing, which is filled with compressed gas, e.g. $SF_6$. This internal conductor 4 carries a high-voltage potential and is kept at a distance from the grounded casing 2 by means of support insulators, not shown.

Furthermore, a tubular projection 5 is arranged on the casing 2, which is sealed to be gas-tight by means of a cover 6. The measuring device 7 structured according to the invention, with an auxiliary electrode 8, is housed in this projection 5, in such a way that the auxiliary electrode 8 extensively covers the passage opening 9 between the casing 2 and the projection 5. Nevertheless, the auxiliary electrode 8 is insulated from the casing 2 by the gas located in the remaining gap.

The auxiliary electrode 8 forms the high-voltage capacitor of a capacitive voltage divider, with the internal conductor 4 of the high-voltage conductor 1, which is insulated in the casing 2. The auxiliary electrode is also connected with the casing 2 via a low-voltage capacitor 10, i.e. the one connection of the low-voltage capacitor 10 is connected to ground potential. Using the measuring device 7, the voltage occurring at the internal conductor 4 can be detected, and the measurement values are passed to the outside via a terminal resistor 11 and a gas-tight coaxial connector 12. The gas-tight coaxial connector is structured as a passage through the cover 6 of the projection 5. The measurement values are passed to a display or measuring device 14, e.g. an oscilloscope, using a shielded measurement connection 13 with a high-ohm input impedance.

Figure 2:
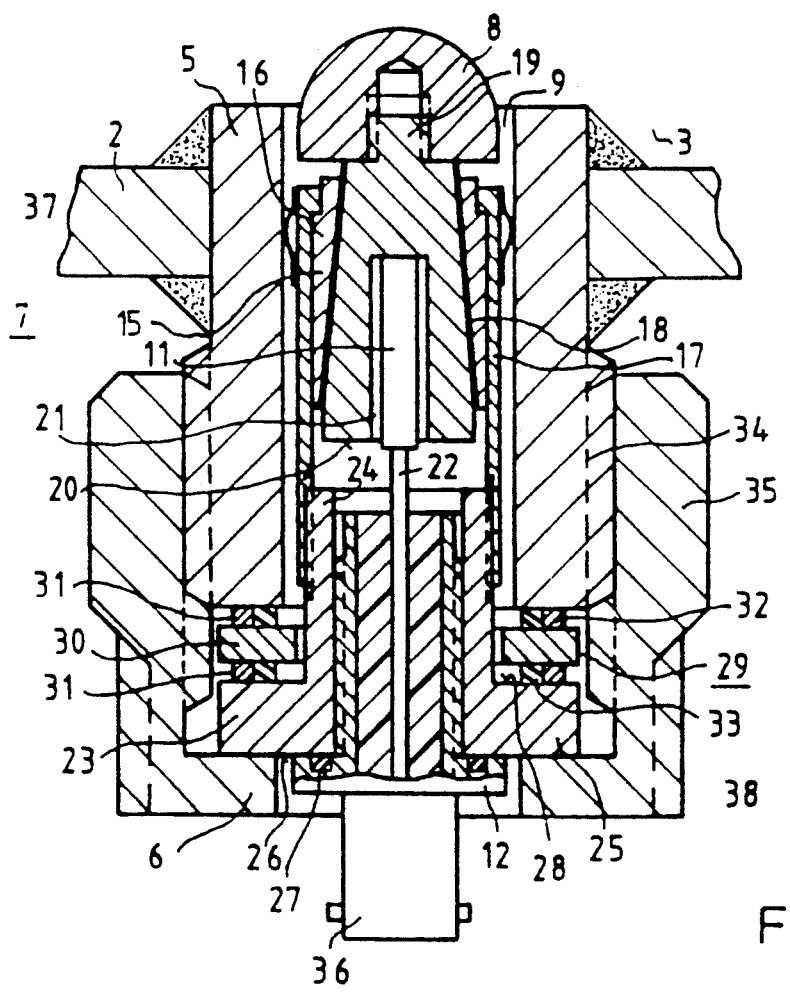
FIG. 2 shows a schematic of a longitudinal cross-section through the measuring device, also schematically.

In order for the measuring device to be able to detect high-frequency transient compensation operations, also, the construction of the measuring device 7 is very compact and space-saving. The design of the measuring device 7 is evident in FIG. 2, in which the same reference symbols are retained for the same parts.

The auxiliary electrode 8 is structured in a hemispherical shape, and projects slightly beyond the passage opening 9 of the tubular projection 5, into the interior 3 of the casing. In this way, the electrical field within the casing 2 is disrupted by the auxiliary electrode 8 as little as possible.

The low-voltage capacitor 10 with the low-voltage capacity $C_N$ is formed from two cones 15, 16, which are shaped as an inside cone 15 and an outside cone 16 and nested together with opposite angles of inclination, and are braced together by a sleeve nut 17 which surrounds the outside cone 16. A polyester film is arranged as a solid dielectric 18, between the inside cone 15 and the outside cone 16 of the low-voltage capacitor 10. The dielectric constant of the polyester film remains the same even at high frequencies.

The inside cone 15 is connected with the auxiliary electrode 8 by a threaded projection 19. In the inside cone 15, a center recess 21 is provided which opens towards the frontal side 20 facing away from the auxiliary electrode 8. The terminal resistor 11 is connected with the inside cone 15 on one side and lies in this recess 21. The other side of the terminal resistor 11 is directly connected with the internal conductor 22 of the gas-tight, coaxial connector 12. This terminal resistor 11 is adapted to the characteristic impedance of the coaxial connector, i.e. of the shielded measurement connection 13, and thus, as an attenuation resistor, prevents electrical oscillations with the capacity of the measurement connection.

In addition to the sleeve nut 17, an adapter 23 also serves as a carrier element of the measuring device 7. The tubular part 24 of the adapter 23 is screwed together with the part of the sleeve nut 17, which projects beyond the frontal side 20 of the inside cone 15. This tubular part 24 of the adapter 23 ends in a ring projection 25, against the outer frontal surface 26 of which the gas seal 27 of the coaxial connector 12 is pressed. The coaxial connector 12 is screwed into the adapter 23. On the other frontal surface 28 of the ring projection 25 of the adapter 23, the gas seal 29 is located between the adapter 23 and the tubular projection 5. This gas seal 29 consists of two gas seal rings 31 connected via a center disk 30 and arranged behind one another. In this way, the entry depth of the auxiliary electrode 8 into the interior 3 of the casing 2 can be adjusted by a varying thickness of the disk 30, or by simply replacing the disk 30. Accordingly, the capacity of the high-voltage capacitor is adjustable, and thus the divider ratio of the capacitive voltage divider can be influenced. The gas seal rings 31 consist of a seal material 33 held in a metal ring 32, whereby a galvanic contact and thus a transfer of the ground potential from the adapter 23 to the tubular projection 5 is achieved, in addition to the gas-tight connection.

The pressure pressing the adapter 23 and the tubular projection 5 of the casing 2 together, which is required for the gas seal 29, is brought about by a second sleeve nut 35 screwed onto an outside thread 34 of the tubular projection 5. The frontal projection of the sleeve nut 35 is pressed against the outer frontal surface 26 of the adapter 23. This sleeve nut 35 thus acts like a cover 6 and seals off the tubular projection 5 except for the projecting coaxial connector 12. For the measurement, the outer contact surface 36 of the coaxial connector 12 is connected with the shielding of the measurement connection 13, its internal conductor 22 produces the contact to the display or measuring device 14.

In order to extensively suppress electrical oscillations between the outside cone 16 and the casing 2, an additional contact 37 between the sleeve nut 17 and the tubular projection 5 is furthermore arranged adjacent to the auxiliary electrode 8. This additional contact 37 consists of a contact spring strip which results in good contact at a low height.

Because of the extremely compact structure of the measuring device 7 with the auxiliary electrode 8, the inside diameter of the tubular projection can be relatively small. Thus, with encased high-voltage conductors that are already in operation, existing gas connections can be utilized as the tubular projection 5. By using a thin polyester film for the dielectric 18 with the low-voltage capacitor 10, the low-voltage capacity $C_N$ is sufficiently great in order to undertake calibration of the measuring device 7, i.e. a determination of the divider ratio of the capacitive voltage divider, at the frequency of the operating alternating voltage, using a high resistance amplifier.

In addition, the second sleeve nut 35 has an outside thread 38 for simple connection of an additional shielding.

What is claimed is:

1. A measuring apparatus for measuring a voltage of a gas-insulated high-voltage conductor having a casing with a mantle surface and an internal conductor, comprising:
   a) an auxiliary electrode configured as a tubular projection on the mantle surface of the casing forming a high-voltage capacitor of a capacitive voltage divider with the internal conductor of the gas-insulated high-voltage conductor, said auxiliary electrode being disposed and insulated in the casing;
   b) an inside cone being coupled to said auxiliary electrode and having an angle of inclination;
   c) an outside cone being nested together with said inside cone at a specifiable distance, having an angle of inclination opposite said angle of inclination of said inside cone and forming a low-voltage capacitor with said inside cone, wherein said auxiliary electrode is coupled to the casing via the low-voltage capacitor;
   d) an interstice formed between said inside and outside cones;
   e) a solid dielectric filling said interstice and having a dielectric constant that remains constant even at high frequencies;
   f) a passage in the tubular projection;
   g) a measurement connection emerging out of the tubular projection via said passage in a gas-tight manner and being coupled to said auxiliary electrode, wherein said auxiliary electrode is connectable to a display or measuring device via said measurement connection;
   h) a terminal resistor; and
   i) a gas-tight coaxial connector having an internal conductor coupled to said inside cone, forming a shielded measurement connection via said terminal resistor, and having a contact surface for shielding the shielded measurement connection galvanically coupled to the casing and to said outer cone, wherein said terminal resistor is adapted to a characteristic impedance of the coaxial connector and/or a characteristic impedance of the shielded measurement connection.

2. The measuring apparatus according to claim 1, further comprising:
   a) an adapter being disposed over said outside cone, carrying said gas-tight coaxial connector in a gas-tight manner and is connected in a gas-tight manner to the tubular projection; and
   b) a sleeve nut being fastened onto said adapter and bracing said inside and outside cones against one another.

3. The measuring apparatus according to claim 2, further comprising a gas seal between said adapter and the tubular projection including a center disk and two gas seal rings connected via said center disk and arranged behind one another.

4. The measuring apparatus according to claim 3, further comprising a galvanic contact produced by said gas seal.

5. The measuring apparatus according to claim 2, further comprising a second sleeve nut having a frontal center part, wherein the tubular projection further comprises an outside thread onto which said second sleeve nut is fastened, and said adapter further comprises a frontal part against which said frontal center part of said second sleeve nut is pressed against.

6. The measuring apparatus according to claim 3, further comprising a second sleeve nut having a frontal center part, wherein the tubular projection further comprises an outside thread onto which said second sleeve nut is fastened, and said adapter further comprises a frontal part against which said frontal center part of said second sleeve nut is pressed against.

7. The measuring apparatus according to claim 4, further comprising a second sleeve nut having a frontal center part, wherein the tubular projection further comprises an outside thread onto which said second sleeve nut is fastened, and said adapter further comprises a frontal part against which said frontal center part of said second sleeve nut is pressed against.

8. The measuring apparatus according to claim 1, wherein said inside cone further comprises a center recess in which said terminal resistor is disposed.

9. The measuring apparatus according to claim 2, wherein said inside cone further comprises a center recess in which said terminal resistor is disposed.

10. The measuring apparatus according to claim 3, wherein said inside cone further comprises a center recess in which said terminal resistor is disposed.

11. The measuring apparatus according to claim 4, wherein said inside cone further comprises a center recess in which said terminal resistor is disposed.

12. The measuring apparatus according to claim 5, wherein said inside cone further comprises a center recess in which said terminal resistor is disposed.

13. The measuring apparatus according to claim 1, wherein said solid dielectric comprises a polyester film.

14. The measuring apparatus according to claim 2, wherein said solid dielectric comprises a polyester film.

15. The measuring apparatus according to claim 3, wherein said solid dielectric comprises a polyester film.

16. The measuring apparatus according to claim 4, wherein said solid dielectric comprises a polyester film.

17. The measuring apparatus according to claim 1, wherein said auxiliary electrode comprises a hemispherical shape.

18. The measuring apparatus according to claim 2, wherein said auxiliary electrode comprises a hemispherical shape.

19. The measuring apparatus according to claim 2, further comprising an additional contact adjacent to said auxiliary electrode disposed between said sleeve nut and the tubular projection.

20. The measuring apparatus according to claim 19, wherein said additional contact comprises a contact spring strip.

* * * * *